(12) United States Patent
Saban et al.

(10) Patent No.: US 8,320,957 B2
(45) Date of Patent: Nov. 27, 2012

(54) METHOD AND SYSTEM FOR REAL TIME CONTROL OF AN ACTIVE ANTENNA OVER A DISTRIBUTED ANTENNA SYSTEM

(75) Inventors: Ofer Saban, Arlington, VA (US); Isaac Shapira, Petach Tikva (IL); Dror Harel, Hod Hasharon (IL); Igor Berlin, Potomac, MD (US)

(73) Assignee: Corning MobileAccess Ltd, Airport City (IL)

( * ) Notice: Subject to any disclaimer, the term of this patent is extended or adjusted under 35 U.S.C. 154(b) by 0 days.

(21) Appl. No.: 13/439,946

(22) Filed: Apr. 5, 2012

(65) Prior Publication Data

US 2012/0236790 A1 Sep. 20, 2012

Related U.S. Application Data

(63) Continuation of application No. 12/488,559, filed on Jun. 20, 2009, now Pat. No. 8,175,649.

(60) Provisional application No. 61/074,157, filed on Jun. 20, 2008.

(51) Int. Cl.
 *H04M 1/00* (2006.01)
 *H04B 1/00* (2006.01)
(52) U.S. Cl. ............... 455/552.1; 455/553.1; 455/562.1; 455/524; 455/561
(58) Field of Classification Search ............... 455/552.1, 455/553.1, 556.1, 557, 524, 562.1
See application file for complete search history.

(56) References Cited

U.S. PATENT DOCUMENTS

| | | | |
|---|---|---|---|
| 2005/0164666 A1* | 7/2005 | Lang et al. | 455/282 |
| 2005/0265428 A1* | 12/2005 | McCorkle | 375/130 |
| 2006/0128425 A1* | 6/2006 | Rooyen | 455/552.1 |
| 2006/0133467 A1* | 6/2006 | Clausen | 375/219 |
| 2006/0152344 A1* | 7/2006 | Mowery, Jr. | 340/310.11 |
| 2006/0172781 A1* | 8/2006 | Mohebbi | 455/571 |
| 2006/0262014 A1* | 11/2006 | Shemesh et al. | 342/386 |
| 2006/0276227 A1* | 12/2006 | Dravida | 455/562.1 |
| 2007/0019959 A1* | 1/2007 | Retnasothie et al. | 398/115 |
| 2007/0058666 A1* | 3/2007 | Pratt | 370/463 |
| 2007/0264009 A1* | 11/2007 | Sabat et al. | 398/5 |
| 2007/0268846 A1* | 11/2007 | Proctor et al. | 370/279 |
| 2010/0093391 A1* | 4/2010 | Saban et al. | 455/552.1 |

\* cited by examiner

*Primary Examiner* — Tilahun B Gesesse
(74) *Attorney, Agent, or Firm* — C. Keith Montgomery (57) ABSTRACT

A method and system suitable for supporting wireless medical telemetry services (WMTS) on a Distributed Antenna System (DAS). A DAS can provide wireless services including voice and data services using the same equipment. WMTS systems can include one or more active antenna units controlled by the MTS access point. The DAS includes control channels for transferring the MTS control and status information between the MTS access point and the antenna. The control channels can be transferred over a separate cable, or transferred using one or more intermediate frequency signals transferred over existing cables DAS between the MTS access point and the antenna. The control channels can be used to configure and control and receive status from the managed components of the DAS including active antennas, control the amplifiers used to process TDD signals, and control the switching of the diversity antenna systems.

17 Claims, 6 Drawing Sheets

METHOD AND SYSTEM FOR REAL TIME CONTROL OF AN ACTIVE ANTENNA OVER A DISTRIBUTED ANTENNA SYSTEM

CROSS-REFERENCE TO RELATED APPLICATIONS

This is a continuation of U.S. patent application Ser. No. 12/488,559, filed Jun. 20, 2009, now U.S. Pat. No. 8,175,649 the content of which is relied upon and incorporated herein by reference in its entirety, and the benefit of priority under 35 U.S.C. §120 is hereby claimed, which claims the benefit of priority under 35 U.S.C. §119 of U.S. Provisional Application Ser. No. 61/074,157, filed on Jun. 20, 2008, the content of which is relied upon and incorporated herein by reference in its entirety.

This application is related to commonly owned U.S. patent application Ser. No. 11/958,062 filed Dec. 17, 2007 and 61/052,851 filed May 13, 2008, which are hereby incorporated by reference in their entirety.

STATEMENT REGARDING FEDERALLY SPONSORED RESEARCH

Not Applicable

REFERENCE TO MICROFICHE APPENDIX

Not Applicable

BACKGROUND

1. Technical Field of the Invention

The present invention is directed to Distributed Antenna Systems (DASs) and more particularly, to methods and systems for real time control of an active antenna over a DAS.

Figure 1:
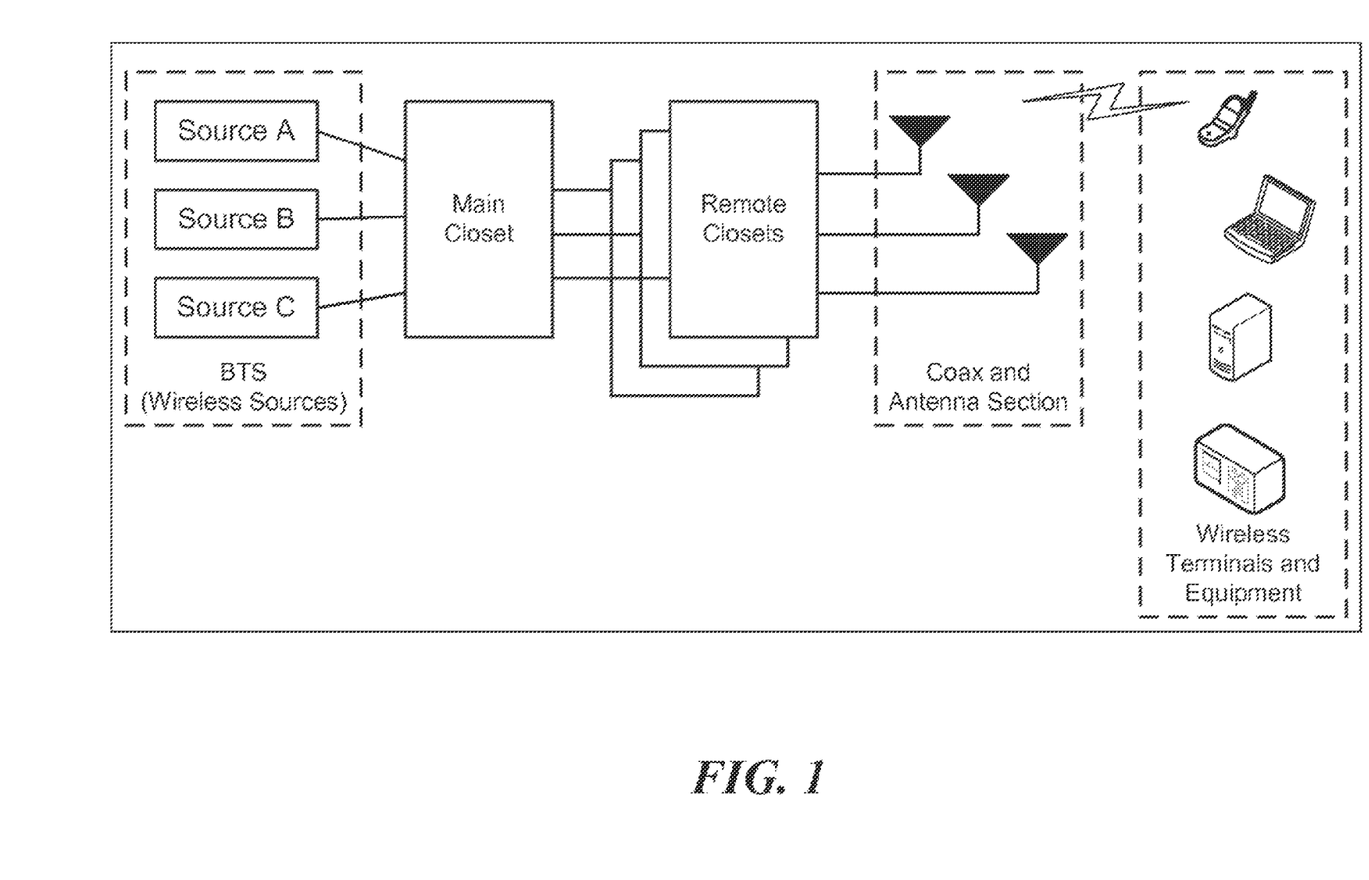
FIG. 1 is a block diagram of a DAS according to the invention.

Distributed Antenna Systems are used to provide or enhance coverage for wireless services such as Public Safety, Cellular Telephony, Wireless LAN and Medical Telemetry inside buildings and over campuses. The general architecture of a DAS is depicted in FIG. 1.

A single DAS can serve a single wireless service (WS) or a combination of many wireless services operating over multiple bands. With respect to medical telemetry services, a medical telemetry system (MTS) access point can be connected to the DAS through the remote wiring closet and using a wireless medical telemetry system (WMTS) module and a service combiner module, the WMTS system can be supported by the DAS using one or more passive antennae.

One desired characteristic of a multi-service DAS is that it can use a single antenna to radiate and receive the signals for all services and frequency bands supported by the DAS. Such an antenna would need to cover (i.e. have acceptable performance) in all frequency bands of interest and is commonly referred to as a Broadband Antenna. An example of a supported frequency range for a DAS antenna would be 400 MHz-6 GHz. To provide MIMO based services, a MIMO antenna which includes multiple antenna elements at a common location can be used.

In referring to the signal flows in DAS systems, the term downlink signal refers to the signal being transmitted by the source transmitter (e.g. cellular base station) through an antenna to the terminals and the term uplink signal refers to the signals being transmitted by the terminals which are received by an antenna and flow to the source receiver. Many wireless services have both an uplink and a downlink, but some have only a downlink (e.g. a mobile video broadcast service) or only an uplink (e.g. certain types of medical telemetry).

2. Description of the Prior Art

A conventional WMTS includes an access point which is connected to the supporting network by a wired connection such as an Ethernet or other LAN connection. The access point typically includes up to 4 radio frequency (RF) connections and at least one control and power connection. Each of the RF connections can be connected directly to an antenna or to a remotely located active antenna unit. Where the access point is connected to one or more remotely located active antenna units, a control and power connection is used to provide power and control signals to the remotely located active antenna. In some embodiments, antenna diversity can be provided to improve quality and reliability of the wireless link by providing two or more separate antenna elements at each antenna unit for a given WMTS link.

SUMMARY

One of the benefits of a DAS is that it can allow many different wireless services to be provided over a common physical infrastructure (wiring, wiring closet units, antenna units and other physical components). Thus, once the physical infrastructure is installed, the same physical infrastructure can be used to support additional wireless services, avoiding the expense of additional equipment and the installation of that equipment. In addition, operational benefits include lower energy costs and potentially lower maintenance costs.

A WMTS can be supported by a DAS, however the DAS may need to be modified to support aspects unique to the WMTS. For example, where a WMTS will require an active antenna, one or more additional connections to provide power and control signals to the active antenna may be needed. While it might be possible to obtain a separate power connection near the location of the remote antenna, a separate control cable can be used to provide the control signals needed to control the active antenna. The separate control cable can provide protection from failure of any of the DAS components that carry the wireless network services and might otherwise carry the control signal in a separate channel. Through the separate control cable the components of the DAS can report DAS signal failures to the base station or control system.

The WMTS signal can be carried over the exiting infrastructure of the DAS and connected to WMTS active antennae at remote locations. On the downlink, the DAS can use passive service combining units in the wiring closet which can passively convert the WMTS RF signals from the WMTS access point to an intermediate frequency (IF) for transmission over the cable run of the DAS to the antenna units and similar passive service combining units connected to (or incorporated in) the antenna units can passively convert the IF signals back to the appropriate RF signal frequency for transmission by the antenna unit to the wireless device. Similarly, on the uplink, the DAS can use the passive service combining units in the antenna units to passively convert the WMTS RF signals received by the antenna units to an intermediate frequency (IF) for transmission over the cable run of the DAS and the passive service combining units in the wiring closet can be used to convert the IF signals back to the appropriate RF signal frequency for input into the WMTS access point. In alternative embodiments of the invention active signal conversion can be used.

In accordance with one embodiment of the invention, the WMTS can be supported by the DAS without the need to run a separate control cable and control signal.

In accordance with one embodiment of the invention, one or more WMTS access points can be connected to one or more DAS antenna units and DAS can be used to backhaul the WMTS data and control signals to the WMTS network connected to the main or remote wiring closet units of the DAS.

In accordance with one embodiment of the invention, one or more reference clock signal generators can be connected to one or more main or remote wiring closet units and the DAS can distribute one or more reference clock signals to any and all components of the DAS. The reference clock signal can be used by the wiring close units and the antenna units to synchronize the frequency and/or time-slot conversion of the signals transferred over the cable run. The cable run can carry multiple wireless services between their respective base stations and/or service networks and the antenna units by using different or non-interfering frequency bands to carry the signals at the same time over the same cable.

The reference clock signal can be used to synchronize the operation and selection of antenna elements and components in diversity antenna systems. The reference clock signal can also be used to synchronize or coordinate the broadcasting of multiple antenna units on the same frequency band to avoid interference associated with two or more antenna units broadcasting on the same frequency at the same time. Each antenna unit can be controlled to broadcast on a specific frequency in a predefined sequence or at a predefined timeslot with a defined time space. In one embodiment, a control signal can be used to control or coordinate the broadcast operation of each antenna unit. In an alternative embodiment, each antenna can be assigned a sequence number and programmed to broadcast only after a specific antenna in the sequence has broadcast or each antenna can be assigned a time slot and programmed to transmit only on a specific frequency during an assigned time slot.

In accordance with one embodiment of the invention, one or more power sources can be connected to one or more main or remote wiring closet units and used to distribute power signals over the DAS to any and all components of the DAS. In this embodiment, the remote wiring closet units and the antenna units can use power supplied by the DAS, obviating the need for a power source at remote wiring closet and antenna unit locations.

One object of the invention is to provide a DAS which can support many wireless services at the same time.

Another object of the invention is to provide a DAS which can support many wireless services at the same time and provide for real time control of one or more active antennae.

Another object of the invention is to provide a DAS which can support many TDD and FDD based wireless services at the same time.

Another object of the invention is to provide a DAS which can support many TDD and FDD based wireless services at the same time and provide for real time control of one or more active antennae.

Another object of the invention is to provide a DAS which can support many TDD based wireless services at the same time using the same TDD amplifier and where all of the TDD based wireless services can to be controlled in real time.

The present invention can be applied to single service and multi-service DAS, in both aggregated and non-aggregated configurations and to both downlink and uplink signal flows.

These and other capabilities of the invention, along with the invention itself, will be more fully understood after a review of the following figures, detailed description, and claims.

DETAILED DESCRIPTION OF PREFERRED EMBODIMENTS

The present invention is directed to a method and system for carrying wireless services including Medical Telemetry Services over a distributed antenna systems (DASs). Medical Telemetry Services include wireless services (WS), for example, in the 600 MHz and 1400 MHz bands that can be used for patient monitoring and communication between medical monitoring equipment and personnel in remote locations. In accordance with one embodiment of the invention, the DAS can includes an interface, a WMTS Module, that connects each WMTS service from a WMTS access point to the DAS and enables the WMTS service signals to be transferred through the DAS. The system can also include one or more control channels for transferring power, control and status information between the WMTS access point and any of the active antennae on the DAS. The control channel can be a cable, such as a CAT 5, multi conductor twisted pair conducting cable or the control channel can be an unused frequency band or channel or available time slot in an existing signal, that can be used to transfer power, control and/or status information between the WMTS access point and any of the managed components including the active antennae on the DAS.

The present invention can also be used to distribute other wireless services (WS) that utilize control channels for controlling TDD functions and diversity antenna system functions. For example, wireless services in the 915 MHz and 2.4 GHz frequency bands can be supported by a DAS in accordance with the present invention.

The DAS can utilize one or more control channels to send control and configuration information to and receive status information from each managed device or component of the DAS. The control channels signals can be transferred over one or more separate cables connected to each managed component of the DAS using any well known method, such as, EIA RS-232, RS-422, RS-432, RS-449, RS-485, RS-530, 20 ma current loop, Ethernet, Token Ring, SCSI, Fiber Channel, and similar technologies. Alternatively, the control channels signals can be transferred over the existing cables of the DAS using one or more of the unutilized frequency bands or channels of the DAS to send and receive signals used to carry information between components of the DAS. Each of the control channels can use the same or different frequency bands or channels and different frequency bands or channels can be used depending on the communication medium used to convey the signals. A single frequency band or channel can be used to carry more than one control channel signal using multiplexing techniques, such as time domain/division multiplexing (TDM), frequency domain/division multiplexing (FDM) and multilevel modulation. For example, the control channels can use one or more channels in the 35 MHz, 60 MHz or 80 MHz band over wired media and one or more channels in the 400 MHz band over optical media. The DAS can use frequency-shift keying (FSK) or amplitude-shift keying (ASK) as the modulation scheme to carry data on the control channel over the DAS. A DAS management system connected to the main wiring closet or the remote wiring closet can communicate with each managed component of the DAS using a unique address assigned to the component. One or more of the control channels can also be used to transfer network data received by one or more antenna units between the antenna unit and an access point connected to a data network.

Each of the control channels can be used to provide a different function. For example, one control channel can be used, for example, by a software management system to control and configure the operation of each managed component of the DAS, another control channel can be used to control in real time, the switching of the amplifier used with TDD signals, and another control channel can be used to control in real time, the switching between the antenna elements that make up a diversity antenna system. Alternatively or, in addition, a control channel can be used change the intermediate frequency used to transfer the wireless services or the control channels over the DAS. A control channel can be used to control in real time, other functions of the managed components of the DAS. In accordance with one embodiment of the invention, each function can use a different control channel to send commands, instructions or configuration information to the managed components of the DAS and receive responses, acknowledgements and status information from the managed components of the DAS, the communication can be full duplex or half duplex using the same or different channels in each direction. In accordance with one embodiment of the invention, one control channel can be used for sending and receiving control and status information.

One or more control channels can be used to control and configure the operation of any or all of the managed components of the DAS, including the antenna units, the wiring closet units and any other device connected to the DAS. The managed components can include wireless devices connected through one of the antenna units. The managed functions can include turning a device (or component thereof) on or off, resetting a device (or a component thereof), setting configuration parameters, checking the status of a device (or a component thereof), testing the operation of a device (or component thereof) or the DAS as a whole. Each device can have an address or identifier that allows a management system to selectively communicate with the device over the DAS.

Figure 2:
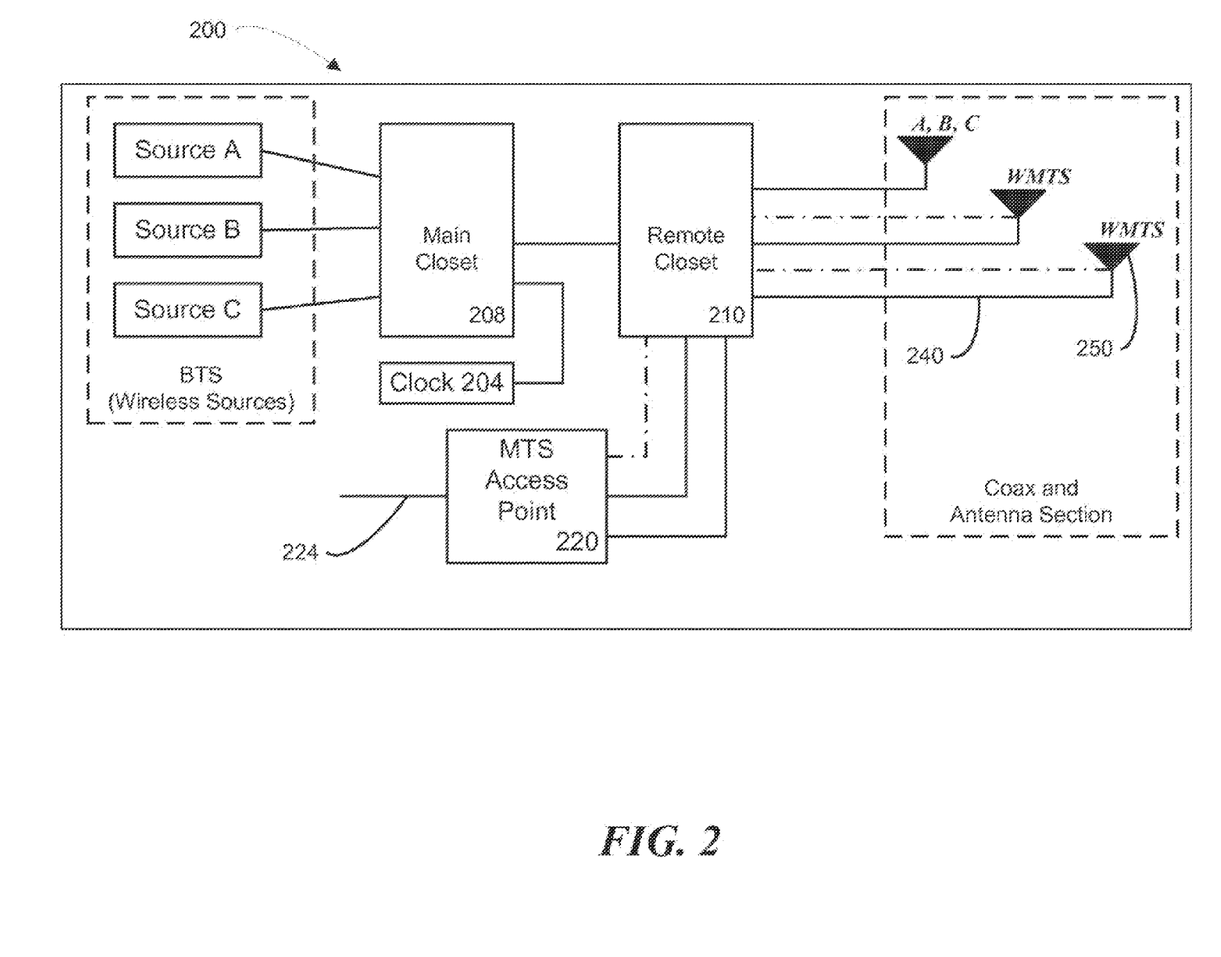
FIG. 2 is a block diagram of a DAS having an MTS access point according to the invention.

As shown in FIG. 2, the wireless medical telemetry service can be supported by the DAS 200 by connecting an MTS access point 220 to the DAS through the remote wiring closet 210 (or the main wiring closet 208). Active or passive service combining components can be used to combine (and separate) the MTS signals with the signals of other wireless services for transmission over the cable run 240 to the remote antennae units 250. At the antenna units 250, active or passive service combining components can separate (and combine) the MTS signals from the other services. The MTS signals received from the MTS network through the network port 224 of the MTS access point 220 can be transferred to active or passive antenna elements for transmission to MTS based equipment and systems as shown in FIG. 1.

In accordance with an embodiment of the invention and as shown in FIG. 2, the DAS can include a clock component 204 for generating a reference clock or synchronization (sync) signal, such as an OCXO clock or a pilot clock signal as described in commonly owned and assigned U.S. Patent Application Ser. No. 61/052,851, filed on May 13, 2008, which is hereby incorporated by reference. The clock generating component 204 can be connected to DAS at the main wiring closet 208 or at any of the remote wiring closets 210, for example, using a service combining unit. Typically the reference clock signal will be a 10 MHz-20 MHz clock signal. The reference clock signal can be transferred to any and all of the components of over the DAS. The reference clock signal can carried on a 1.5 GHz-2.0 GHz carrier signal that is distributed over the physical infrastructure of the DAS. Each component of the DAS can include a Phase Lock Loop (PLL) based component that is adapted and configured to regenerate, extract or recover the reference clock signal from the carrier signal. In some embodiments of the invention, the clock can be delivered at a high frequency (1.5-3 GHz) in order to reduce the potential to introduce noise or interferences to other services and particularly where the communication medium includes an optical communication medium. In some embodiments of the invention, where the communication medium includes a coaxial cable the original clock frequency 10-20 MHz can be used to deliver the reference clock signal. The reference clock signal can be used for up-converting or down-converting radio frequency (RF) signals to intermediate frequency (IF) signals for transmission over different communication media of the DAS, for example from the wiring closet to the remote antenna units and for up-converting or down-converting the IF signals to an RF signal for broadcast by the antenna units and similar conversions in the uplink direction.

Figure 3:
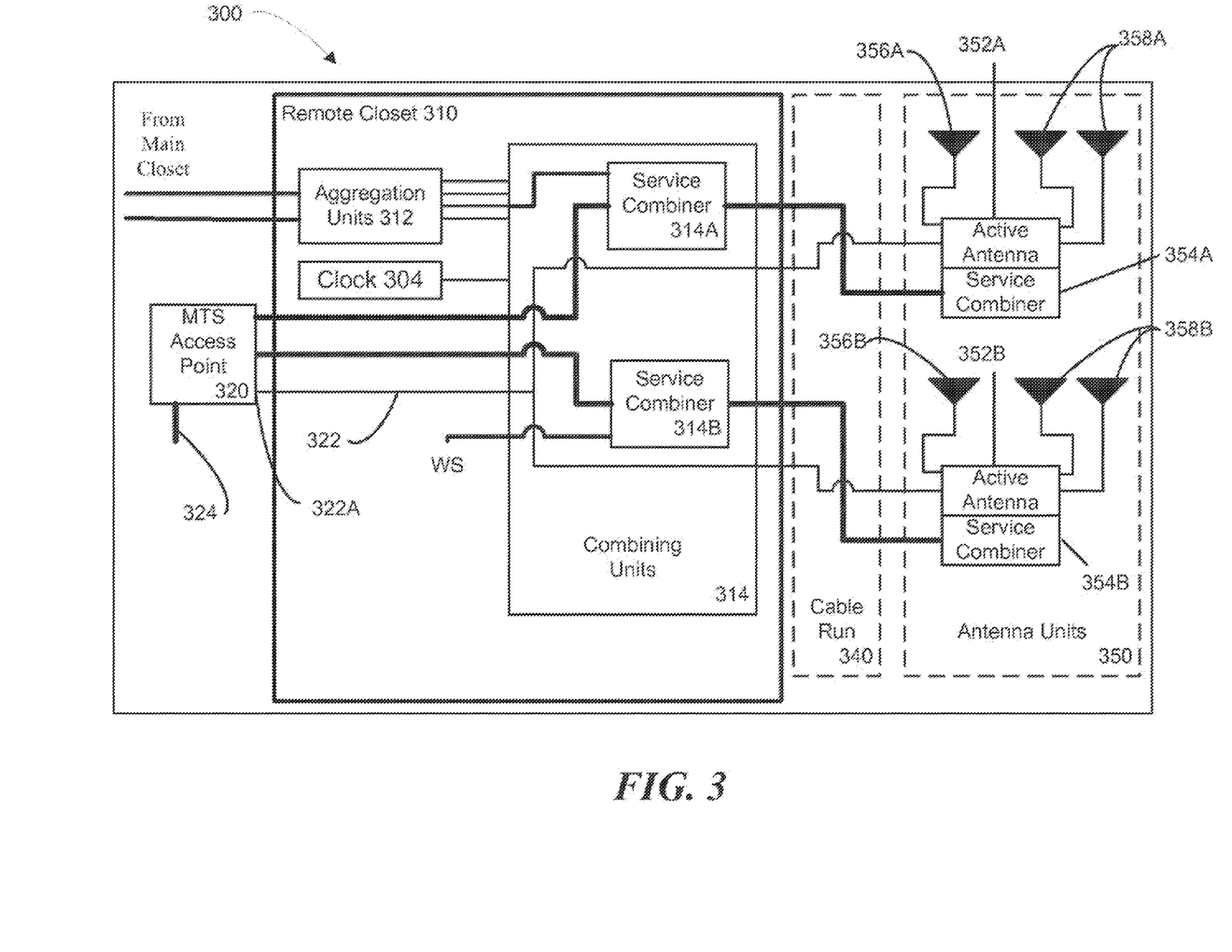
FIG. 3 is a block diagram of a DAS according to one aspect of the invention.

As shown in FIG. 3, the system 300 according to one embodiment of the invention can include in a remote wiring closet 310, one or more wiring closet or combining units 314, and one or more MTS access points or interfaces 320, one or more cable runs 340, and one or more antenna units 350. The system 300 can include a combination of active and passive antenna units or modules 350, for example, an active antenna unit 352A for communication over a 600 MHz band, an active antenna unit 352B for communication over a 1400 MHz band, a passive antenna unit for communication over a 2.4 GHz band and a passive antenna for communication over a 5.8 GHz band. The system 300 can optionally include one or more BTS systems to provide other wireless services (shown in FIG. 2), one or more aggregation units 312 and a main closet unit (shown in FIG. 2). One or more of the combining units 314 can include a connection enabling one or more BTS systems to be connected, either directly or indirectly through an intervening wiring closet.

The MTS access point 320 connects the supporting MTS network to the DAS 300 allowing the MTS signals received through the MTS network port 324 to be transferred wirelessly using the antenna units 350 of the DAS between the MTS access point 320 and wireless MTS equipment, servers and terminals (as shown in FIG. 1). The MTS access point 320 can include one or more RF signal ports for transferring the MTS RF signals between the MTS access point 320 and the MTS antenna units 352A and 352B. The MTS access point 320 can also include one or more control ports 322A for transferring power, control and status information between the MTS access point 320 and the MTS antenna units 352A and 352B.

The remote wiring closet 310 can include one or more service combining units 314 that can be used to combine the signals of the different wireless services carried over the DAS 300. Each service combiner 314A and 314B is capable of being connected to one or more wireless services (WS) and capable of converting each of the RF wireless signals to intermediate frequency (IF) signals (corresponding to unused frequency bands or channels) for transmission over the cable run 340 of the DAS to the antenna units 350. At each antenna unit 352A and 352B, a similar service combiner 354A and 354B is capable of converting the received IF signal to RF signals for transmission by the antennae elements 356A, 356B, 358A and 358B. Similarly, for uplink signals, service combiner 354A and 354B convert the RF signals to IF signals (corresponding to unused frequency bands or channels) for transmission over the cable run 340 of the DAS to service combiner 314A and 314B which converts them back to RF for transmission to the MTS access point 320 and back to the MTS network. A reference clock signal generator 304 can be connected to one of the signal combining elements 314 of the DAS to enable the reference clock signal to be distributed over the DAS to any and all components. Each service combiner 314A, 314B, 354A, and 354B can include a clock regenerator circuit or phase lock loop based circuit that receives the reference clock signal and uses the reference clock signal to up convert or down convert, in synchronized fashion, the DAS signals from RF to IF and from IF to RF as needed.

In accordance with one embodiment of the invention, each of the active antenna units 352A and 352B can include at least one diversity antenna configuration 358A and 358B for supporting WMTS and at least one separate antenna element 356A and 356B for supporting other wireless services. A diversity antenna configuration can include two or more diversity antenna elements and associated transceiver components in order to provide improved communication performance and reliability. The diversity antennae can use the reference clock signal or a signal derived from the reference clock signal to synchronize and control the operation of the diversity antenna elements and components. The reference clock signal can also be used to synchronize the antenna units 350 to reduce or eliminate interference by controlling when each antenna unit 350 transmits on a specific frequency band and limiting or preventing two or more antenna units 350 from transmitting at the same time on the same frequency band possibly causing interference. Each service combiner 354A and 354B can also be connected to one or more passive antenna elements (not shown).

As shown in FIG. 3, the system 300 can also include a control channel 322 which can be used to transfer power and control and status information between the MTS access point 320 and the active antenna units 352A and 352B of the DAS. The control channel 322 can be transferred over a separate cable connection run between control channel port 322A of the MTS access point 320 and the active antenna units 352A and 352B of the DAS. In accordance with one embodiment of the invention, the cable can be a CAT 5 multiple conductor twisted pair cable and control signals and power can be provided to the antenna units 352A and 352B using power over Ethernet technology. Alternatively, power can be provided to the antenna units 352A and 352B using a direct current signal sent over the cable run 340. In other embodiments of the invention, the cable can be a coaxial cable, a fiber optic cable, a single twisted pair cable or a multiple conductor cable (using for example, Ethernet or RS-232 communication). In addition, the connection between the MTS access point 320 and the active antenna units 352A and 352B of the DAS can include more than one cable type, using interfaces for signal conversion where necessary.

Figure 4:
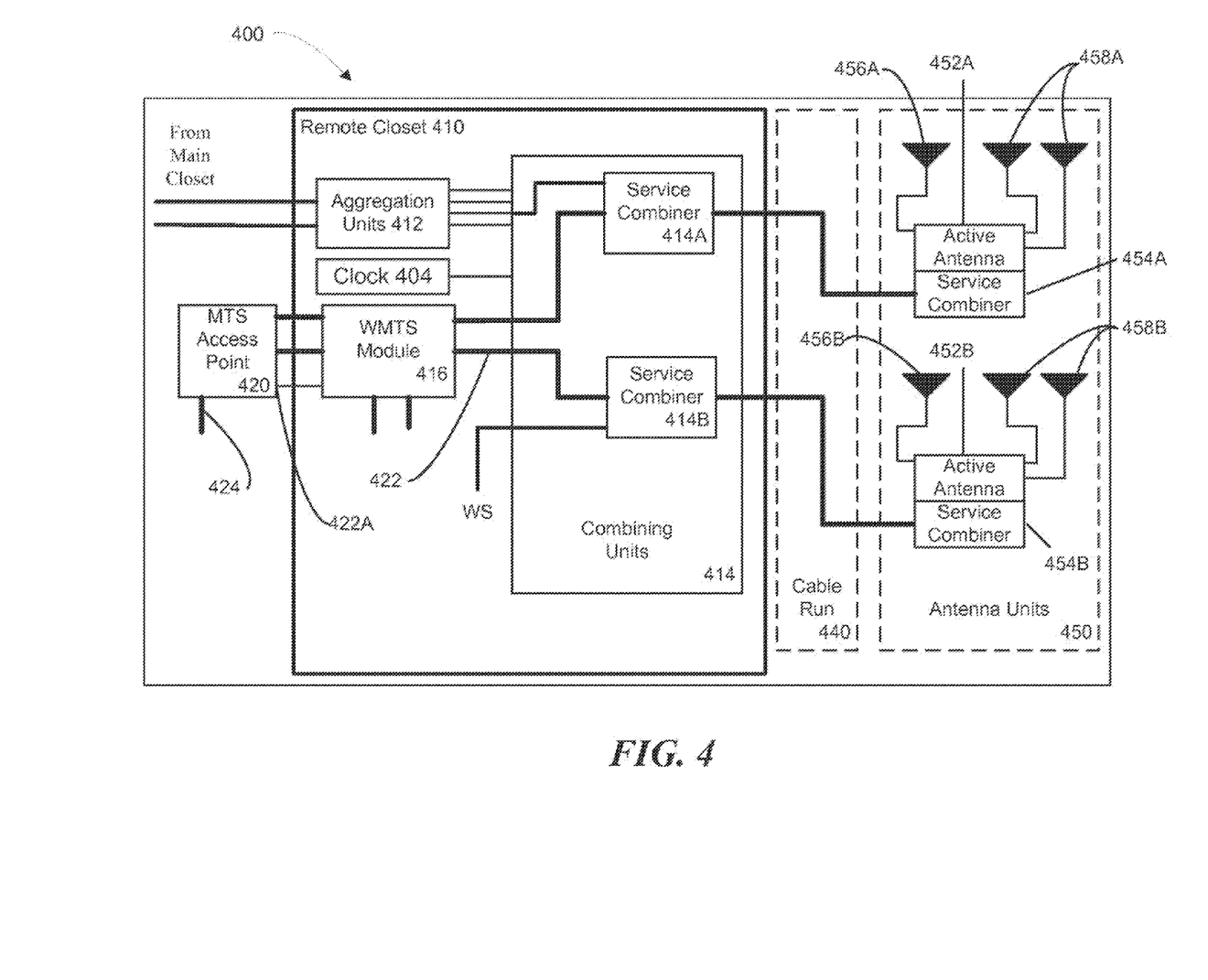
FIG. 4 is a block diagram of a DAS according to one aspect of the invention.

FIG. 4 shows a system 400 according to an alternate embodiment of the invention. Similar to FIG. 3, system 400 can include a remote wiring closet 410 including one or more wiring closet or combining units 414A and 414B, an MTS access point 420 that includes a network port 424 that connects the wireless MTS services network to the DAS through an interface module 416, a cable run 440 and antenna units 450. The antenna units 450 can be active antenna 452A and 452B and include service combining units 454A and 454B, diversity antenna configuration 458A and 458B for WMTS and at least one separate antenna element 456A and 456B for other wireless services (WS). One or more of the combining units 414 can include a connection enabling one or more BTS systems to be connected, either directly or indirectly through an intervening wiring closet. In this embodiment, the system 400 can also include a WMTS module 416 for interfacing the MTS access point 420 with the DAS 400.

In this embodiment of the invention, a separate cable connection is not needed to support the control channel. In accordance with this embodiment of the invention, the control channel port 422A of the MTS access point 420 can be connected to a control channel port of the WMTS module 416 and the control channel signals 422 can be converted by the WMTS module 416 to an intermediate frequency (IF) control signal for transmission over the DAS to the antenna units 450. At each antenna unit 450 can include a service combiner 454A and 454B which is adapted to receive the IF control signal and extract the control channel signal 422 and transfer the control channel signal 422 to the active antenna 452A and 452B. Similarly, the service combiner 454A and 454B can receive the control channel signal 422 from the active antenna 452A and 452B, convert it to an IF control signal for transmission over the DAS to WMTS module 416 which can receive the IF control signal, extract the control channel signal 422 and transfer the control channel signal 422 to the MTS access point 420 through the control channel port 422A. The conversion between the control channel signal and IF control signal at each service combiner unit can be accomplished using the reference clock signal that is distributed over the DAS. A reference clock signal generator 404 can be connected to one of the signal combining elements 414 of the DAS to enable the reference clock signal to be distributed over the DAS. Each service combiner 414A, 414B, 454A, and 454B and the WMTS Module 416 can include a clock regenerator circuit or phase lock loop based circuit that receives the reference clock signal and uses the reference clock signal to up convert or down convert, in synchronized fashion, the DAS signals from RF to IF and from IF to RF as needed.

The control channel can be used to control in real time the switching functions (for the diversity antenna) and amplification functions of the active antenna 452A and 452B. In accordance with one embodiment of the invention, the WMTS can be a time division duplexed (TDD) signal and the control channel can be used to control the timing and time slot selection of the TDD based communications used by the WMTS. In addition, the control channel can be used to control the amplification of WMTS signals transmitted and received by the active antenna 452A and 452B. The control of the switching functions and the amplification functions of one or a set of antenna units 450 can be synchronized using the reference clock signal or a signal derived from the reference clock signal. In accordance with one embodiment of the invention, one or more Active antenna 452 may be connected to the DAS 400. For each active antenna 452, a separate control channel can be used and the control channels multiplexed together on the same signal or frequency band using well known multiplexing techniques for example, time domain/division multiplexing, frequency domain/division multiplexing, or multilevel modulation, etc).

In accordance with one embodiment of the invention, each of the active antenna units 452A and 452B can include at least one diversity antenna configuration 458A and 458B for supporting WMTS and at least one separate antenna element 456A and 456B for supporting other wireless services. A diversity antenna configuration can include two or more diversity antenna elements and associated transceiver components in order to provide improved communication performance and reliability. The diversity antennae can use the reference clock signal or a signal derived from the reference clock signal to synchronize and control the operation of the diversity antenna elements and components. The reference clock signal can also be used to synchronize the antenna units 450 to reduce or eliminate interference by controlling when each antenna unit 450 transmits on a specific frequency band and limiting or preventing two or more antenna units 450 from transmitting at the same time on the same frequency band possibly causing interference. Each service combiner 454A and 454B can also be connected to one or more passive antenna elements (not shown).

Figure 5:
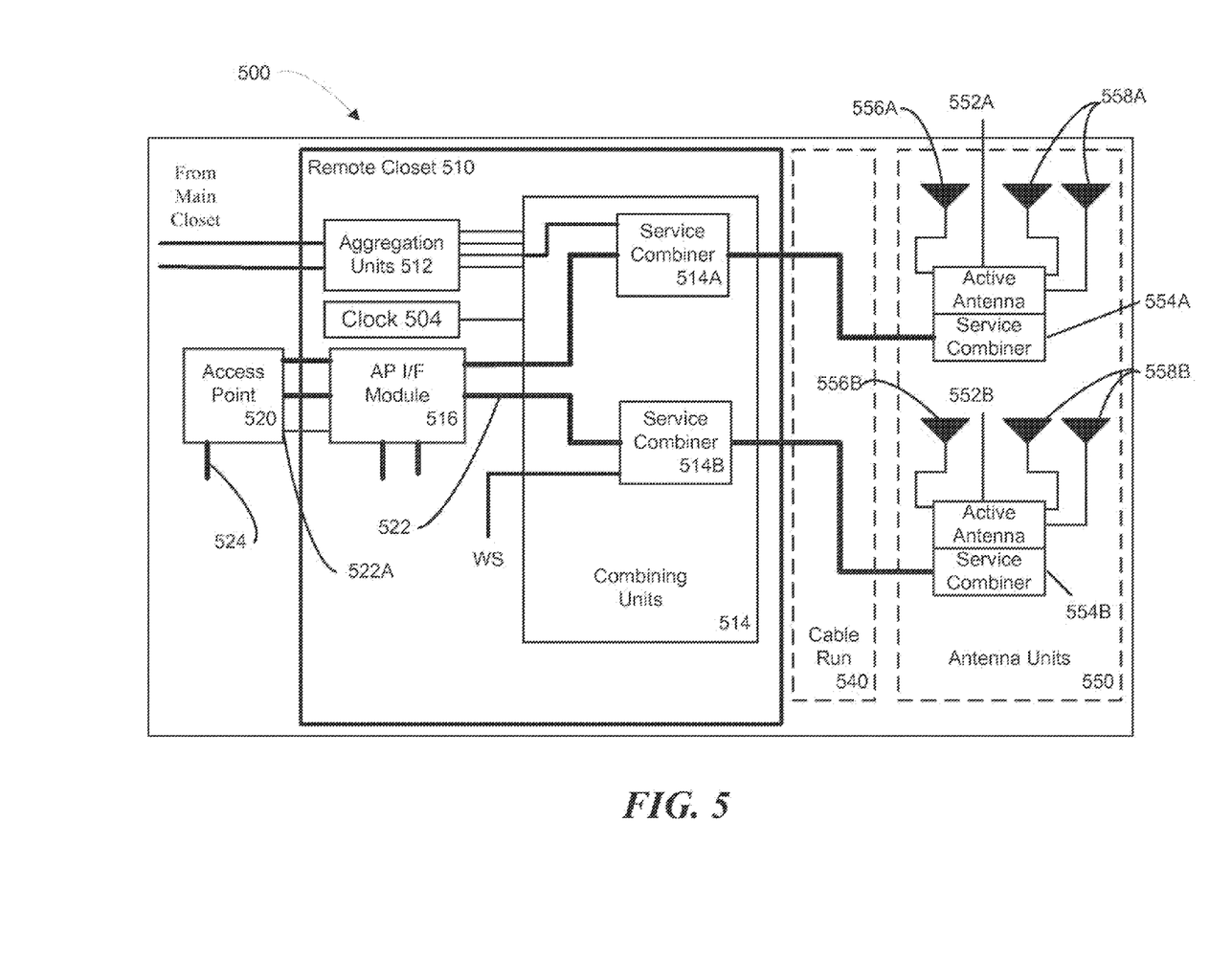
FIG. 5 is a block diagram of a DAS according to one aspect of the invention.

FIG. 5 shows a system 500 according to an alternate embodiment of the invention. Similar to FIGS. 3 and 4, system 500 can include a remote wiring closet 510 including one or more wiring closet or combining units 514A and 514B, an access point 520 that includes a network port 524 that connects a wireless services network to provide the wireless services (for example, those using the 915 MHz and 2.4 GHz frequency bands) over the DAS, a cable run 540 and antenna units 550. The antenna units 550 can be one or more active antenna units 552A and 552B and passive antenna units and include service combining units 554A and 554B, diversity antenna configuration 558A and 558B for wireless services and at least one separate antenna element 556A and 556B for other wireless services. One or more of the combining units 514 can include a connection enabling one or more BTS systems to be connected, either directly or indirectly through an intervening wiring closet. In this embodiment, the system 500 can also include an access point interface module 516 for interfacing the access point 520 with the DAS 500.

In this embodiment of the invention, a separate cable connection is not needed to support the control channel. In accordance with this embodiment of the invention, the control channel port 522A of the access point 420 can be connected to a control channel port of the access point interface module 516 and the control channel signals 522 can be converted by the access point interface module 516 to an intermediate frequency (IF) control signal for transmission over the DAS to the antenna units 550. At each antenna unit 550 can include a service combiner 554A and 554B which is adapted to receive the IF control signal and extract the control channel signal 522 and transfer the control channel signal 522 to the active antenna 552A and 552B. Similarly, the service combiner 554A and 554B can receive the control channel signal 522 from the active antenna 552A and 552B, convert it to an IF control signal for transmission over the DAS to access point interface module 516 which can receive the IF control signal, convert it back to the original wireless services frequencies of the control channel signal 522 and transfer the control channel signal 522 to the access point 520. A reference clock signal generator 504 can be connected to one of the signal combining elements 514 of the DAS to enable the reference clock signal 522 to be distributed over the DAS.

Each service combiner 514A, 514B, 554A, and 554B can include a clock regenerator circuit or phase lock loop based circuit that receives the reference clock signal and uses the reference clock signal to up convert or down convert, in synchronized fashion, the various DAS data and control signals from RF to IF and from IF to RF as needed.

The control channel can be used to control in real time the switching functions (for the diversity antenna) and amplification functions of the active antenna 552A and 552B. In accordance with one embodiment of the invention, the wireless service can be a time division duplexed (TDD) signal and the control channel can be used to control the timing and time slot selection of the TDD based communications used by the wireless service. In addition, the control channel can be used to control the amplification of wireless service signals transmitted and received by the active antenna 552A and 552B.

In accordance with one embodiment of the invention, each of the active antenna units 552A and 552B can include at least one diversity antenna configuration 558A and 558B for supporting a first wireless service and at least one separate antenna element 556A and 556B for supporting other wireless services. A diversity antenna configuration can include two or more diversity antenna elements and associated transceiver components in order to provide improved communication performance and reliability. The diversity antennae can use the reference clock signal or a signal derived from the reference clock signal to synchronize and control the operation of the diversity antenna elements and components. The reference clock signal can also be used to synchronize the antenna units 550 to reduce or eliminate interference by controlling when each antenna unit 550 transmits on a specific frequency band and limiting or preventing two or more antenna units 550 from transmitting at the same time on the same frequency band possibly causing interference. Each service combiner 554A and 554B can also be connected to one or more passive antenna elements (not shown).

Figure 6:
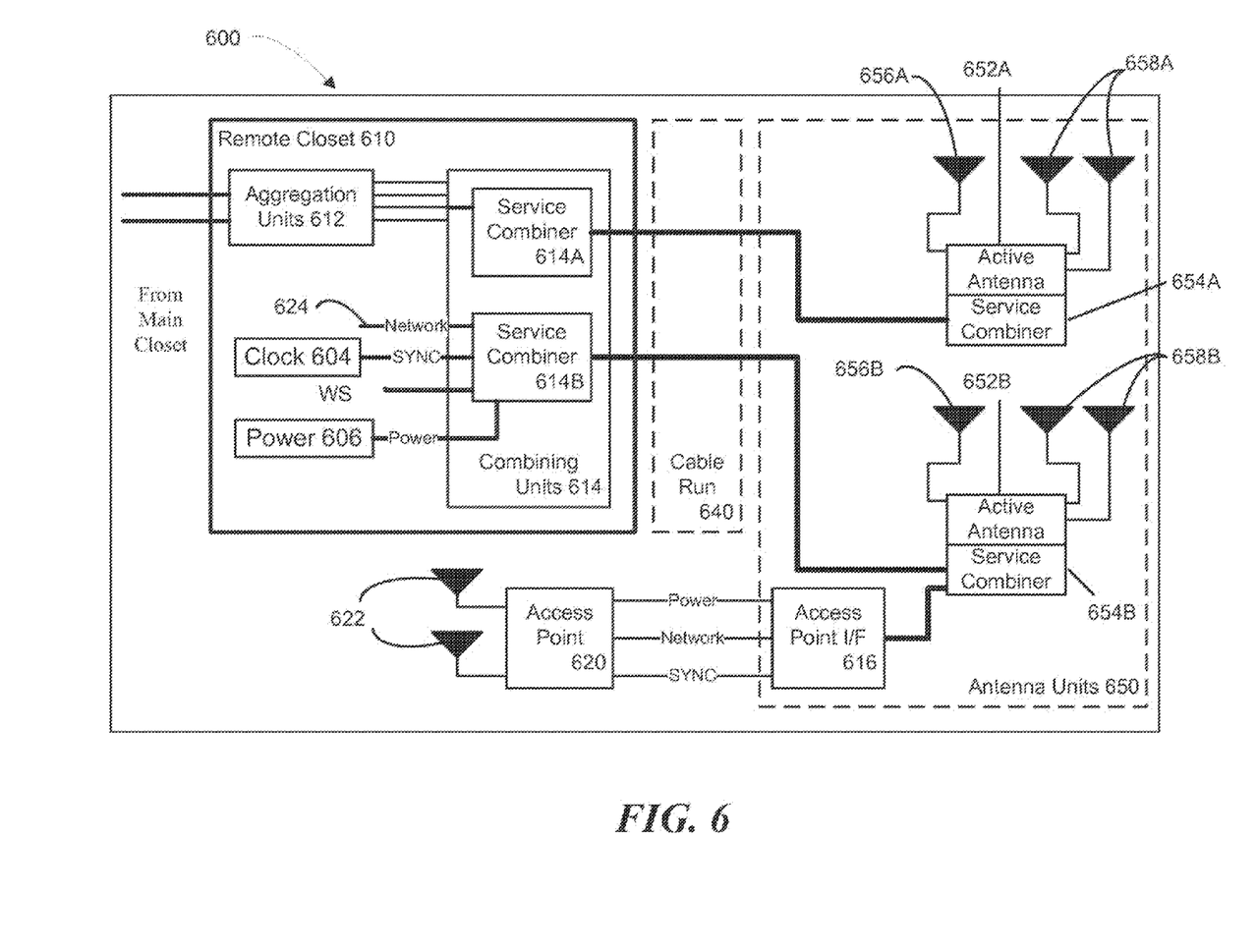
FIG. 6 is a block diagram of a DAS according to one aspect of the invention.

FIG. 6 shows a system 600 according to an alternate embodiment of the invention. Similar to FIGS. 3, 4 and 5, system 600 can include a remote wiring closet 610 including one or more wiring closet or combining units 614A and 614B, a cable run 640 and one or more antenna units 650. The antenna units 650 can be one or more active antenna units 652A and 652B and passive antenna units and include service combining units 654A and 654B, diversity antenna configuration 658A and 658B for wireless services and at least one separate antenna element 656A and 656B for other wireless services. One or more of the combining units 614 can include a connection enabling one or more BTS systems to be connected, either directly or indirectly through an intervening wiring closet. In this embodiment, the system 600 can also include one or more access points 620 connected to one or more interface modules 616 for interfacing the access point 620 directly with one or more antenna units 652A, 652B. One or more of the combining units 614 can include interfaces for connecting the DAS to one or more wireless services (WS) including a data network based service, for example, an Ethernet network or a LAN. In addition, one or more of the combining units 614 can include interfaces for connecting one or more reference clock signal generators 604 to the DAS provide one or more reference clock signals (SYNC) that can be distributed to any or all of the components of the DAS. Further, one or more of the combining units 614 can include interfaces for connecting a power source 606 to the DAS provide power (for example, 1-3V DC, 5V, 12V, up to 50VDC) that can be distributed to any or all of the components of the DAS.

The access point 620 can provide an interface to the wireless services (for example, those using the 915 MHz and 2.4 GHz frequency bands) accessed through one or more antenna units 650 of the DAS.

In this embodiment of the invention, a separate cable connection is not needed to support the control channel. In accordance with this embodiment of the invention, one or more data channels, the control channel and the reference clock signal can be distributed over the DAS to the antenna units 650 and the access point 620. Access to one or more of the data channels and the control channel can be provided by a network interface 624 (such as an Ethernet network interface) at one of the service combiners, such as service combiner 614B, which can distribute one or more data channels and the control channel over the DAS using an unused frequency band supported by the DAS. In one embodiment, one or more data channels and the control channel can be transferred using a baseband signal, such as the standardized Ethernet baseband signal used with coaxial cable (for example, 10 BASE2, 10 BASE5). These communication channels can be bidirectional and operate in full duplex and half duplex modes. The service combiners 654A and 654B at the antenna units 650 can recover the one or more data channels and the control channel and convert them to a network signal, such as an Ethernet signal or other communication technology. Similarly, status and response signals from the managed components of the DAS, such as the antenna units 650 can be sent back to the network interface at the service combiner 614B. The network interface 624 can be directly connected (or indirectly connected over a LAN, VLAN or WAN) to the wireless services network, such as an MTS network, for transferring the wireless services data, allowing the DAS to backhaul wireless services data. In addition, a terminal, such as a personal computer which includes software for sending control and configuration signals and receiving status signals (responsive signals including alerts) can also be connected to the wireless services network. The network can be any network technology including, for example, Ethernet, Token Ring, Sonet, other standardized and proprietary network technologies that can be used to transfer data and voice.

The reference clock signal can be provided by a reference clock source 604 that is connected to the SYNC interface at one of the service combiners, such as service combiner 614B, which can distribute the reference clock signal over the DAS using an unused frequency band supported by the DAS. The reference clock signal can be used to synchronize the up conversion and down conversion, in synchronized fashion, of signals carried over the DAS as they are converted from their native frequencies to their intermediate frequencies for transfer over the DAS and as they are converted from their intermediate frequencies to their native frequencies at the ends of the cable run.

The control channel port of the access point 620 can be connected to a control channel port of the access point interface module 616 and the control channel signals can be transferred between the antenna units 650 and access point 620 through the access point interface module 616. Each antenna unit 650 can include a service combiner 654A and 654B which is adapted to send and receive control signals between the antenna components 652A, 656A, 658A, 652B, 656B, 658B, the access point 20 and interface on the service combiner 614B in the wiring closet. This allows the control channel to be used to send control signals to and receive control signals from the access point 620 to check status and control functions related to the operation of the access point 20. Each service combiner 614A, 614B, 654A, and 654B can include a clock regenerator circuit or phase lock loop based circuit that receives the reference clock signal and uses the reference clock signal to up convert or down convert the various DAS data and control signals from RF to IF and from IF to RF as needed. The reference clock signal can be provided to the access point 620 through the access point IF 616 from the service combiner 654B. The access point interface 616 can also include a power port for receiving power from one or more of the antenna units 650. The DAS can use the cable run 640 to transfer power in the form of a direct current signal from the remote closet, for example, to the antenna units 650.

In accordance with one embodiment of the invention, the access point 620 can use the Ethernet connection to transfer network data and control signals over the DAS to the wireless services network connected to the Ethernet interface of service combiner 614B. In some embodiments of the invention, the access point 620 can include a diversity antenna configuration and the access point 620 can receive the reference clock signal (SYNC) from one of the antenna units 650 and use this signal (or a signal derived from the SYNC signal) to synchronize and control the operation of the diversity antenna elements and components.

In accordance with one embodiment of the invention, the wireless service can be a time division duplexed (TDD) signal and the control channel can be used to control the timing and time slot selection of the TDD based communications used by the wireless service. In addition, the control channel can be used to control the amplification of wireless service signals transmitted and received by the active antenna 652A and 652B and/or the access point antenna 622.

In accordance with one embodiment of the invention, the reference clock or SYNC signal (or a signal derived from the SYNC signal) can be used to synchronize and control the broadcast operations of two or more antenna units 650 or access point antennae 622 in order to reduce interference caused by two antenna units 650 or access points 620 transmitting on the same frequency band at the same time. In accordance with one embodiment, this can be accomplished using the SYNC signal (or a signal derived from the SYNC signal) and optionally the control signal to cause each antenna unit 650 or access point 620 to transmit in ordered or sequential fashion. In accordance with one embodiment of the invention, each antenna unit 650 or access point 620 can be assigned a time slot and each antenna unit 650 or access point 620 can be configured and controlled according to a start control signal that initiates the transmission sequence that causes each antenna unit 650 or access point 620 to transmit only during their assigned time slot. In accordance with one embodiment of the invention, the SYNC signal can be a 1 pulse per second signal received or extracted from a GPS (Global Positioning System) receiver (distributed over the SYNC channel of the DAS) and used to synchronize one or more components of an indoor network with a macro network.

In accordance with one embodiment of the invention, the access point interface 616 can convert the signals received from one or more of the service combiners to another format suitable for use by the access point 620. For example, the access point interface 616 can convert the Ethernet sign received from the service combiner 654B from a 10 Base2 or 10 Base5, full duplex format to a 10 Base-T, full duplex or half duplex format. In addition, the access point interface 616 can filter and regenerate the SYNC signal from a pilot signal received from the service combiner 654B. The access point interface 616 can also process the power signal to remove noise, such as by filtering, step up or step down the voltage and isolate the power. In accordance with one embodiment, the access point interface 616 can convert the 50V grounded power signal to an insolated standard power over Ethernet power signal. In one embodiment of the invention, the access point interface 616 can provide separate physical connections (for example, 3 separate connectors, network, power, control) to connect the access point 620 to the access point interface 616. In an alternative embodiment of the invention, each of the connections can be multiplexed on one cable, for example, a CAT-5 network cable. In this embodiment, the network and control signals can use 2 of the twisted pair cables and the power can be supplied over 2 of the twisted pair cables.

It is noted that in various drawing figures, more than one cable appears to connect the components of the DAS. In accordance with the invention, only one physical cable can be used to convey the described signals, although in alternative embodiments of the invention more than one cable can be used. In addition, the cables disclosed herein can any medium that can be used to transfer a signal from one location to another and that combinations of different cable types can be used, including multi-conductor cables. The cables can be electrical or optical or radio frequency conducting media.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations.

Further, while the description above refers to the invention, the description may include more than one invention.

What is claimed is:

1. A distributed antenna system comprising:
   at least one cable run connecting a first combining unit to at least one antenna unit;
   the first combining unit including a base station connection capable of connecting the base station to the first combining unit, the first combining unit being capable of transferring signals corresponding to a first wireless service between the base station and the cable run;
   at least one wireless service access point connected to the first combining unit, the first combining unit being capable of transferring signals corresponding to a second wireless service between the at least one wireless access point and the cable run;
   a first interface module connected to the wireless service access point and capable of converting a control signal sent from the wireless service access point to an intermediate frequency (IF) control signal and transferring the IF control signal between the wireless service access point and the first combining unit;
   a second combining unit connected to the cable run and capable of receiving the IF control signal and converting the IF control signal back to the control signal and transferring the control signal to the at least one antenna unit of the distributed antenna system; and
   a reference clock signal generator connected to the first combining unit and capable of generating a reference clock signal.

2. The distributed antenna system of claim 1, wherein the first combining unit is capable of receiving the reference clock signal and transmitting the reference clock signal over the cable run to at least one antenna unit.

3. The distributed antenna system of claim 2, wherein the first combining unit uses the reference clock signal to convert a signal received from the access point corresponding to the second wireless service to an intermediate frequency signal and transfers the intermediate frequency signal over the cable run to at least one antenna unit.

4. The distributed antenna system of claim 3, wherein the first combining unit is capable of transferring the IF control signal between the first interface module and the cable run.

5. The distributed antenna system of claim 3, wherein the control signal controls amplification functions of the at least one antenna unit.

6. The distributed antenna system of claim 5, wherein the second combining unit uses the reference clock signal to convert the intermediate frequency signal received from the first combining unit to the signal corresponding to the second wireless service and transfers the signal corresponding to the second wireless service to at least one antenna unit.

7. The distributed antenna system of claim 3, wherein the at least one antenna unit is a diversity antenna having two or more antenna elements and the control signal and the reference clock signal are used by the diversity antenna to select which antenna element is used to broadcast signals corresponding to the second wireless service.

8. The distributed antenna system of claim 3, wherein the distributed antenna system includes two or more antenna units and the reference clock signal is used by each of the two or more antenna units to synchronize broadcasting sequentially to avoid interference.

9. A distributed antenna system comprising:
   at least one cable run connecting a first combining unit to at least one antenna unit comprising a plurality of diversity antennas;
   the first combining unit including a base station connection capable of connecting the base station to the first combining unit, the first combining unit being capable of transferring signals corresponding to a cellular telephony service between the base station and the cable run;
   at least one wireless service access point connected to the first combining unit, the first combining unit being capable of transferring signals corresponding to a wireless medical telemetry service between the at least one wireless access point and the cable run;
   a first interface module connected to the wireless service access point and capable of converting a control signal sent from the wireless service access point to an intermediate frequency (IF) control signal and transferring the IF control signal between the wireless service access point and the first combining unit;
   a second combining unit connected to the cable run and capable of receiving the IF control signal and converting the IF control signal back to the control signal and transferring the control signal to the at least one antenna unit of the distributed antenna system, wherein the control signal controls which one of the plurality of diversity antennas is used; and
   a reference clock signal generator capable of generating a reference clock signal.

10. The distributed antenna system of claim 9, wherein at least one of the diversity antennas uses the reference clock signal or a signal derived from the reference clock signal to synchronize and control the operation of diversity antenna elements.

11. The distributed antenna system of claim 10, wherein the first combining unit is capable of transferring the IF control signal between the first interface module and the cable run.

12. The distributed antenna system of claim 9, wherein the reference clock signal is used to reduce interference by controlling when each antenna transmits on a specific frequency band.

13. The distributed antenna system of claim 12, wherein the first combining unit is capable of transferring the IF control signal between the first interface module and the cable run.

14. A distributed antenna system comprising:
a cable run connecting a first combining unit to at least one antenna unit comprising a plurality of antennas;
the first combining unit including a base station connection capable of connecting the base station to the first combining unit, the first combining unit being capable of transferring signals corresponding to a first wireless service between the base station and the cable run;
a network port capable of connecting a second wireless service network to the first combining unit and the first combining unit being capable of transferring signals corresponding to a second wireless service between the second wireless service network and the cable run;
a second combining unit connected to the cable run and the second combining unit being capable of receiving first signals corresponding to the first wireless service and second signals corresponding to the second wireless service and transferring the signals corresponding to the first wireless service between the cable run and at least one antenna connected to the second combining unit; and
an interface module connected to the second combining unit, wherein
the signals corresponding to the second wireless service include control signals and the controls signals cause sequencing of transmission from different ones of the plurality of antennas to reduce interference between transmissions.

15. The distributed antenna system of claim 14, further comprising a reference clock signal generator capable of generating a reference clock signal.

16. The distributed antenna system of claim 15, wherein the reference clock signal is used to reduce interference by controlling when each antenna transmits on a specific frequency band.

17. The distributed antenna system of claim 16, wherein the interface module connects the second combining unit to at least one wireless service access point and transfers the second signals corresponding to the second wireless service between the second combining unit and the at least one wireless access point.

* * * * *